United States Patent [19]
Benveniste

[11] Patent Number: 5,821,677
[45] Date of Patent: Oct. 13, 1998

[54] ION SOURCE BLOCK FILAMENT WITH LAYBRINTH CONDUCTIVE PATH

[75] Inventor: Victor M. Benveniste, Gloucester, Mass.

[73] Assignee: Eaton Corporation, Cleveland, Ohio

[21] Appl. No.: 760,714

[22] Filed: Dec. 5, 1996

[51] Int. Cl.$^6$ ............................. H01J 17/26; H01J 61/28
[52] U.S. Cl. ...................................................... 313/231.41
[58] Field of Search .......................... 313/231.41, 363.1, 313/495; 250/492.2, 492.3, 423 R, 427

[56] References Cited

U.S. PATENT DOCUMENTS

| | | |
|---|---|---|
| 4,714,834 | 12/1987 | Shubaly . |
| 5,026,997 | 6/1991 | Benveniste . |
| 5,262,652 | 11/1993 | Bright et al. . |
| 5,420,415 | 5/1995 | Trueira . |
| 5,497,006 | 3/1996 | Sferlazzo et al. . |

FOREIGN PATENT DOCUMENTS 1011398  12/1964  United Kingdom .

*Primary Examiner*—William L. Oen
*Attorney, Agent, or Firm*—Watts, Hoffmann, Fisher & Heinke Co. L.P.A.

[57] ABSTRACT

A filament plate for an ion beam source assembly of an ion implantation apparatus is disclosed. The filament plate is comprised of tungsten and includes two spaced apart spiral slits through a width of the plate. A gap width of the slits in not substantially greater than ten times a plasma Debye length of ions generated by electrons emitted into an arc chamber. The plate filament is disposed in an arc chamber into which ionizable source materials are injected. The plate includes two conductive posts press fit into openings of the plate for heating the plate to the thermionic emission temperature. The conductive posts extend through insulated openings in a side wall of the arc chamber.

7 Claims, 4 Drawing Sheets

ION SOURCE BLOCK FILAMENT WITH LAYBRINTH CONDUCTIVE PATH

FIELD OF THE INVENTION

The present invention relates to a filament for ionizing source materials in an arc chamber of an ion implantation apparatus and, more particularly, to a filament comprising a tungsten block having two spiral slits forming a labyrinth conductive path.

BACKGROUND OF THE INVENTION

One known technique for introducing dopants into a semiconductor wafer involves directing a beam of ions along a path of travel and selectively positioning silicon wafers to intersect the ion beam. This technique has been widely used in ion implantation apparatuses to dope wafers with controlled concentrations of an ionized dopant material.

One example of a commercial ion implantation apparatus is the Eaton model NV 20 Implanter. The Eaton implantation apparatus comprises an ion beam source assembly including an arc chamber defining an interior region into which controlled concentrations of gaseous source materials including ionizable gas (e.g., oxygen) and vaporized dopant materials (e.g., arsenic) are injected. A cover plate or extraction member overlies an open side of the arc chamber. The extraction member includes an elliptical opening or arc slit through which ionized molecules escape the arc chamber interior region.

A cathode comprising a filament is disposed in the arc chamber. The filament is energized elevating its temperature to emit electrons into the arc chamber interior region. The electrons collide with the source material gas molecules, yielding energy to ionize the molecules. Ionized molecules escaping the arc chamber interior region through the arc slit are accelerated along a path of travel thereby forming an ion beam which intersects target wafers at an implantation station and implants the wafers with ionized dopant molecules. An ion source assembly utilizing a cathode filament is disclosed in U.S. Pat. No. 4,714,834 to Shubaly, which is assigned to the assignee of the present invention.

In prior art ion implanters, the cathode filament typically comprises a single loop of tungsten wire. An electric potential is applied across the filament to heat it to a thermionic emission temperature wherein free electrons are emitted by the filament. The ionization of gaseous source materials in the arc chamber interior region generates a plasma of highly ionized gas having nearly equal numbers of ions and electrons. The density of the ions and electrons is such that the socalled Debye shielding length is much smaller than the dimensions of the filament. The Debye shielding length is a characteristic distance in a gaseous source material plasma beyond which the electric field of a charged particle is shielded by particles having charges of the opposite sign. Only that portion of the filament, perpendicular to a magnetic field impressed on the arc chamber, actually undergoes thermionic emission. Because it is immersed in the gaseous source material plasma, ion sputtering occurs, over the entire outer surface of the energized filament. The sputtering action erodes, the entire outer surface of the filament and ultimately causes it to fail.

SUMMARY OF THE INVENTION

A filament block or plate for thermionically emitting electrons is disposed in an interior region of an arc chamber. The arc chamber, in turn, is disposed in an evacuated interior region of an ion source housing. The plate is made of tungsten. Ionizable gaseous source materials are injected into the interior region of an arc chamber of the source. The filament plate is energized to a thermionic emission temperature that causes electrons to strike the ionizable gaseous source material and generate a plasma of source ions. A preferred filament plate includes two spaced apart spiral slits cut through a width of the plate. The slits are substantially parallel to each other over a portion of their respective lengths and each slit terminates near a center region of the plate. The slits form a labyrinth spiraled conductive path for thermionic heating of the plate.

The slits are characterized by a gap, which is the perpendicular distance between side wall surfaces defining the slit. Each slit has a substantially uniform gap width over the length of the slit. Further, the two slits have gaps which are substantially equal. For each slit, the gap width is preferably not greater than ten times the Debye shielding length of the charged source material plasma. Such a slit gap width quickly attenuates the energy of the energized plasma entering the slit so erosion of the filament plate interior wall surfaces defining the slits by the plasma is minimized.

The filament plate includes two spaced apart openings near opposite ends of the plate. Conductive posts for energizing the filament block extend through apertures in a side wall of the source bounding an arc chamber. An insulator disposed within each aperture isolates the conductive posts from the arc chamber side wall. A potential difference is applied across the conductive posts causing a current to flow through the filament plate along the labyrinth spiraled conductive path defined by the slits. The top surface of the filament plate is positioned within the arc chamber such that the top surface is perpendicular to a magnetic field impressed on the arc chamber by an electromagnet located outside the ion source.

When the filament plate is energized and heated to the thermionic emission temperature, free electrons are emitted into an interior region of the arc chamber. A top surface of the filament plate provides a large, efficient surface for thermionic emission superior to the prior art looped wire filament.

One object of the present invention is to provide a source material ionizing filament for use in an ion implantation apparatus wherein the filament has an increased useful life.

Another object of this invention is to provide a filament wherein sputtering erosion is limited to an area that is less than an entire surface area of the filament.

Yet another object of this invention is to provide a filament wherein the thermionic emission area is large providing for efficient ionization of source material.

These and other objects, advantages and features of the invention will become better understood from a detailed description of a preferred embodiment of the invention which is described in conjunction with the accompanying drawings.

DETAILED DESCRIPTION

Figure 1:
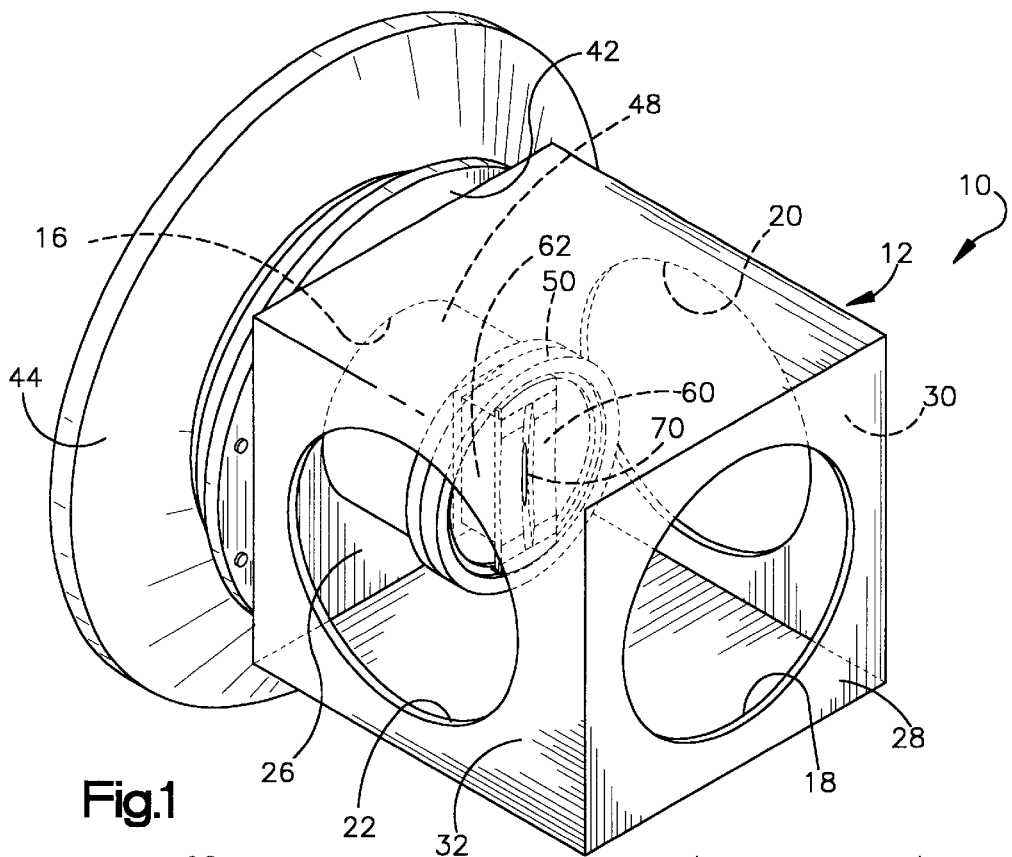
FIG. 1 is a schematic perspective view of a portion of an ion beam source assembly of an ion implanter.
Figure 2:
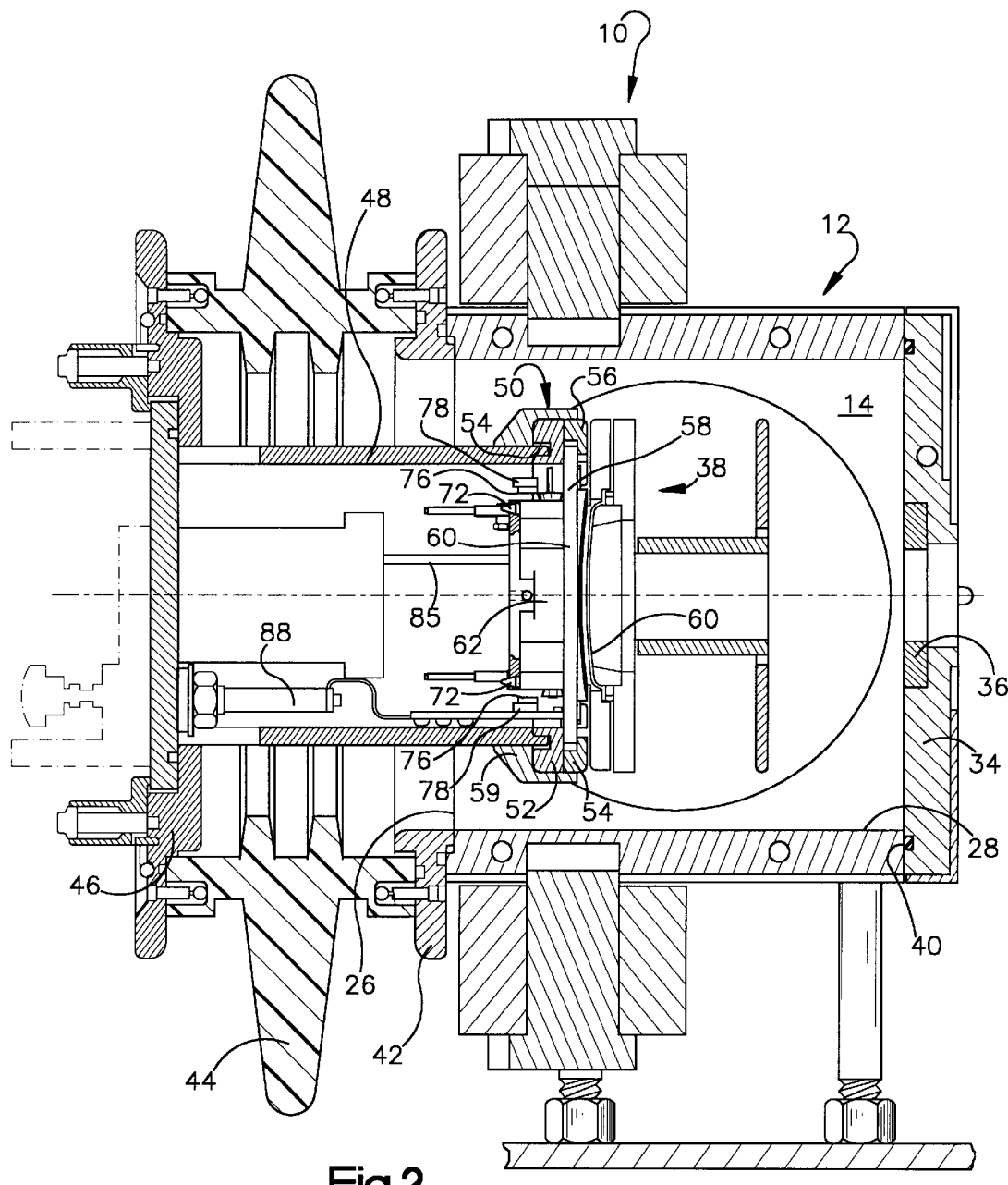
FIG. 2 is a sectional view of an ion beam source assembly.

Turning to the drawings, an ion beam source assembly of an ion implanter is shown generally at 10 in FIGS. 1 and 2. The ion beam source assembly 10 includes a cube-shaped ion source housing 12. The ion source housing 12 is made of aluminum and has an interior cavity 14 which is evacuated by pumps (not shown) when the ion beam source assembly is in operation. An arc chamber 62 is supported within the ion source housing 12. The arc chamber 62 has a base 64 and side walls 66 extending from the base. The side walls 66 and base 64 define an interior region 68. Source materials, which, when energized, generate an ion plasma, are routed into the arc chamber interior region 68. An open side of the arc chamber 62 is overlaid by an extraction member 60. Ion generated in the arc chamber 62 exit through the a slit 70 in the extraction member 60 and are shaped into an ion beam by ion beam shaping extraction electrodes 38. The ion beam exits the ion source housing 12 through an opening 18 in a housing wall 28.

Disposed within the arc chamber interior region 68 are a filament plate 80 of the present invention and an electron repeller plate 82. The filament plate 80 is heated to a thermionic emission temperature by an electric current flowing through the plate from a conductive post 106 to a conductive post 108 to emit free electrons. The filament block 80 is placed at a negative potential relative to the arc chamber 62, his accelerates the emitted electrons which collide with ionizable gaseous source materials injected into the arc chamber interior region 68. The electron - source material collisions result in ionization of the source materials. The repeller plate 82 is negatively charged to repel electrons generated by the filament plate 80 to minimize the loss of electrons. The gaseous source materials to be ionized are injected into the arc chamber interior region 68 through a gas inlet aperture 84 through which a source material tube 85 (FIG. 2) extends.

Figure 5:
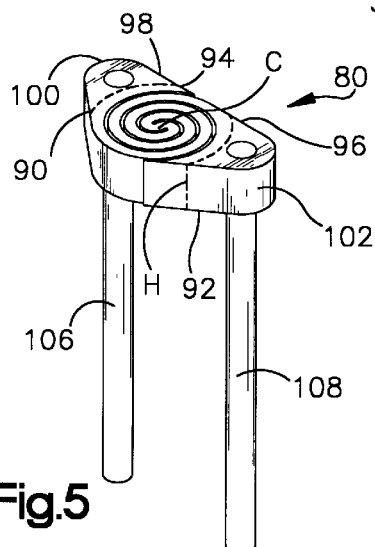
FIG. 5 is a perspective view of the filament plate of FIG. 3.
Figure 8:
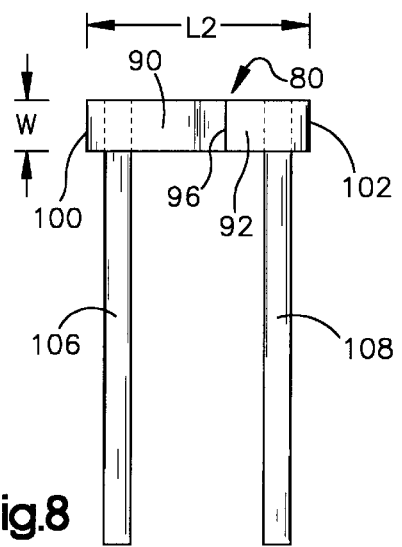
FIG. 8 is an elevation view of the plate filament of FIG. 3 as seen from a plane indicated by line 8—8 in FIG. 6.
Figure 6:
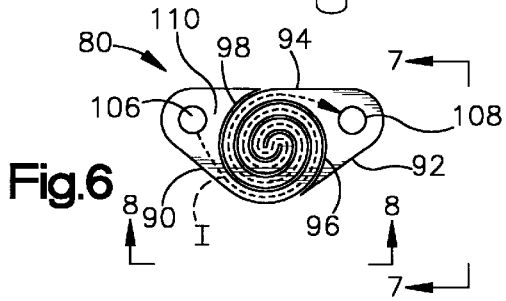
FIG. 6 is a top plan view of the filament plate of FIG. 3.
Figure 7:
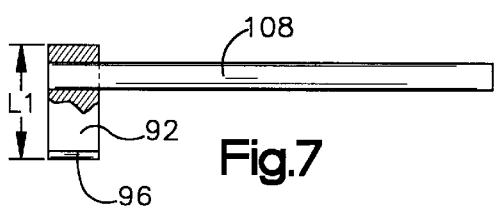
FIG. 7 is a side elevation view of the plate filament of FIG. 3 as seen front a plane indicated by line 7—7 in FIG. 6.

Turning to FIGS. 5–7, the filament plate 80 is comprised of tungsten and, as best seen in FIG. 6, is configured in the shape of an isosceles triangle with rounded corners. Two spiral cuts or slits 96, 98 are cut through the width W of the filament plate 80. Preferably, the slits 96, 98 are made in the filament plate 80 using a wire EDM (electron discharge machining) method, well known to those skilled in the art. The slits 96, 98 extend from the side walls 92, 94 respectively and spiral inwardly at increasingly tighter radii toward a common center region C of the filament plate 80. As can best be seen in FIG. 6, the slits 96, 98 overlap and are parallel over most of their respective lengths. A gap width or normal distance between opposing interior wall surfaces of the filament plate 80 defining each slit 96, 98 is uniform along the length of the slit. Moreover, the gap width is substantially the same for each slit. Suitable dimensions for a length L1 of the short side walls 90, 92 and a length L2 of the long side wall 94, a width W of the filament plate 80 and a gap width are as follows:

|  | Dimension |
|---|---|
| L1 (Length of short side walls 90, 92) | 1.2 cm. |
| L2 (Length of long side wall 94) | 2.0 cm. |
| W (Width of filament plate 80) | 0.3 cm. |
| Gap width distance of each slit 96, 98 | 0.3 mm. |

Figure 3:
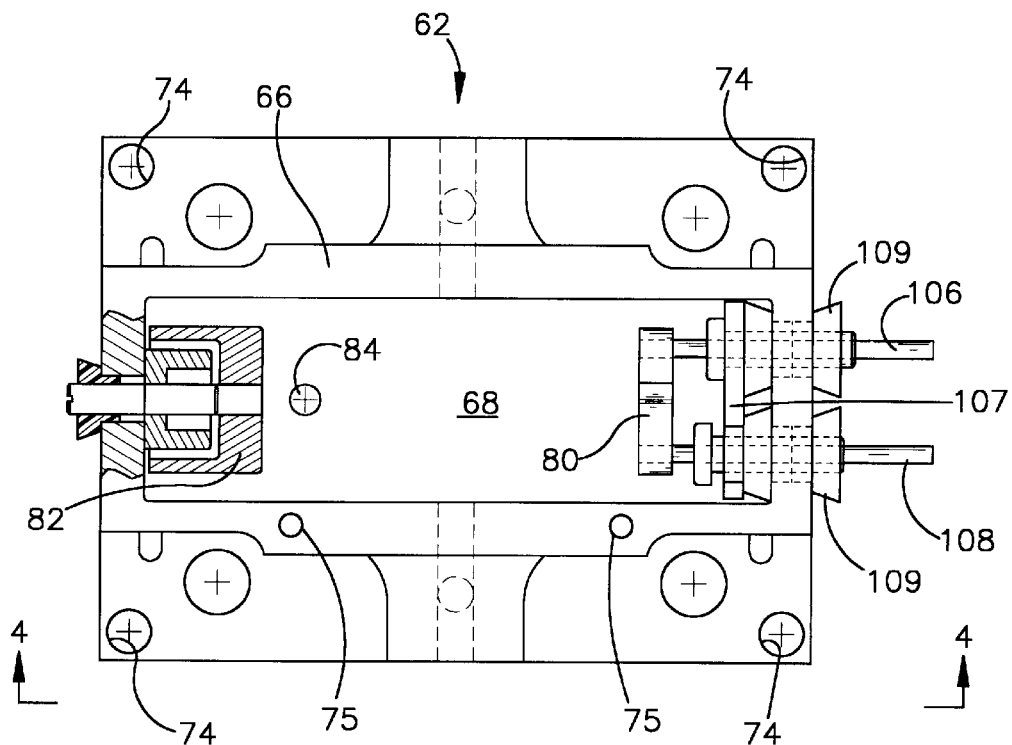
FIG. 3 is a top plan view an arc chamber including a filament plate of the present invention.
Figure 4:
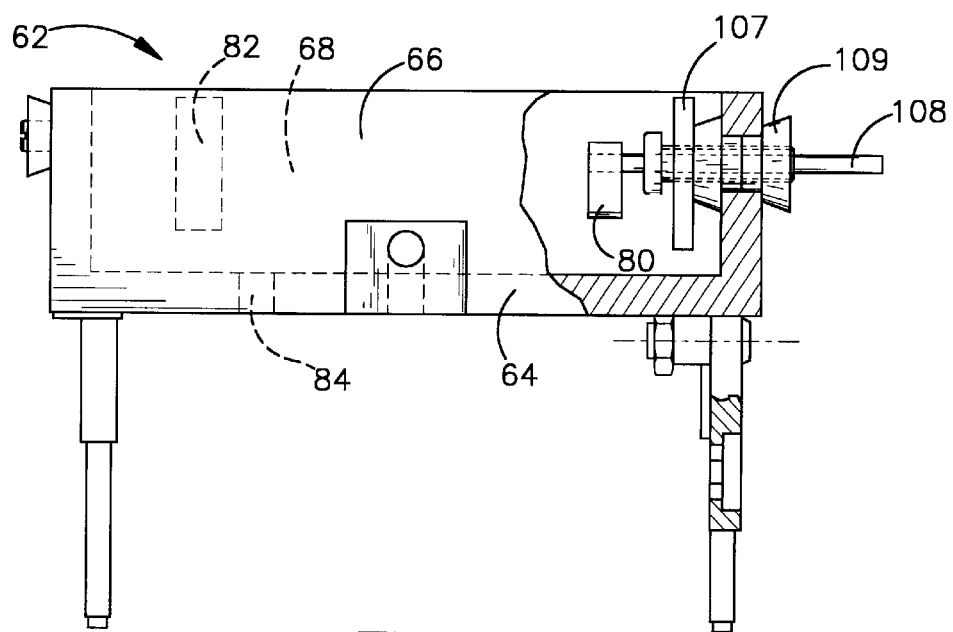
FIG. 4 is a view partly in elevation and partly in section of the arc chamber of FIG. 3 as seen from a plane indicated by the line 4—4 in FIG. 3.

The filament plate 80 includes two throughbores spaced inwardly from corners 100, 102. The pair of spaced apart conductive posts 106, 108 are press fit into respective openings. As can best be seen in FIGS. 3 and 4, the filament plate 80 is positioned in the arc chamber interior region 68 spaced from the side wall 66 and oriented such that a top surface 110 of the filament plate is substantially parallel to the side wall which also support the repeller plate 82. The conducting posts 106, 108 extend through a pair of aligned holes in the arc chamber side wall 66. Insulators 109 are sandwiched between the conductive posts 106, 108 and the side wall openings to insulate the arc chamber 62 from the conducting posts. A protective plate 107 is positioned on the conductive posts 106, 108 between the insulators 109 and the filament plate 80. The protective plate 107 prevents metallic deposition on the insulators 109.

Two power feeds 88 (one of which can be seen in FIG. 2) are connected to the conductive posts 106, 108. When the power feeds 88 are energized, a current flows through the plate 80 along a spiraled labyrinth path I (FIG. 6). Where the slits 96, 98 overlap, the current path I has a substantially constant width from an outer portion of the filament plate 80 to the common center region C, that is, a spacing between adjacent slits as measured along a radius extending outwardly from the common center region C is substantially constant.

The current flow I through the filament plate 80 is suitably adjusted to raise the temperature of the plate to the thermionic emission temperature causing the plate to emit free electrons. A top surface 110 (FIG. 6) of the filament plate 80 provides a large, efficient surface for thermionic emission.

Preferably, the gap width of the slits 96, 98 is not substantially greater than ten times a Debye shielding length of a charged plasma generated from typical source materials injected into the arc chamber interior region 68. Debye shielding lengths for plasma having arsenic, phosphorous or antimony source materials range between 0.1 to 0.5 millimeters (mm.). Thus, the preferred gap width of 0.30 mm. is not greater than ten times the Debye shielding length of even a plasma with a 0.1 mm. Debye shielding length. Such a slit gap width is so narrow that an energized plasma cannot be sustained in the gap, that is, the energy of the energized plasma entering the slits 96, 98 is quickly attenuated so that plasma erosion of the interior wall surfaces of the filament plate 80 defining each slit 96, 98 is minimized.

Erosion by sputtering is substantially limited to the top surface 110 of the filament plate 80. Sputtering does not occur on a bottom surface 112 of the filament plate 80 because a volume of the arc chamber interior region 58 defined between the filament plate bottom surface 112 and the region of the arc chamber side wall 66 through which the conductive posts 106, 108 extend is too small to sustain a plasma.

Figure 9:
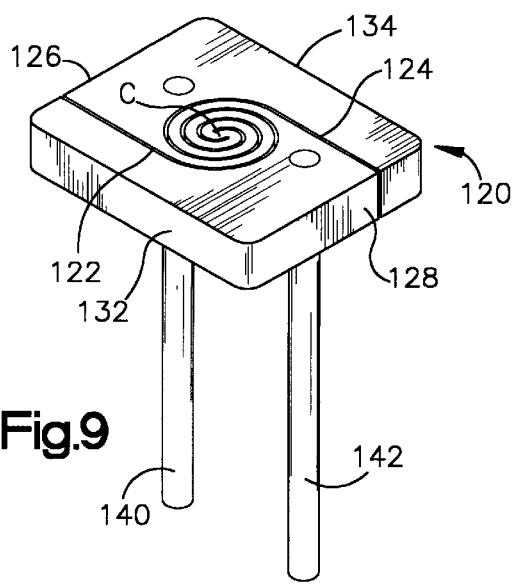
FIG. 9 is a perspective view of a second embodiment of a filament plate of the present invention.
Figure 12:
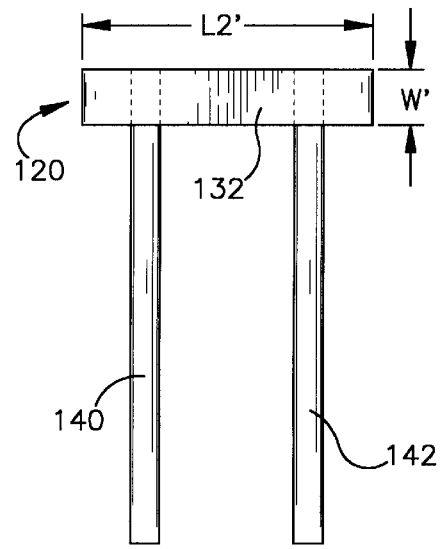
FIG. 12 is a front elevation view of the filament plate of FIG. 9 as seen from a plane indicated by the line 12—12 in FIG. 10.
Figure 10:
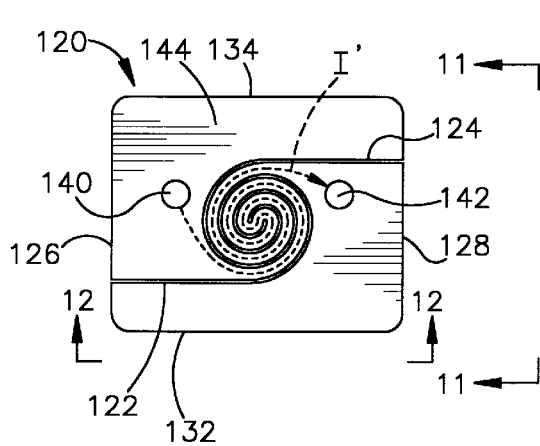
FIG. 10 is a top plan view of the filament plate of FIG. 9.
Figure 11:
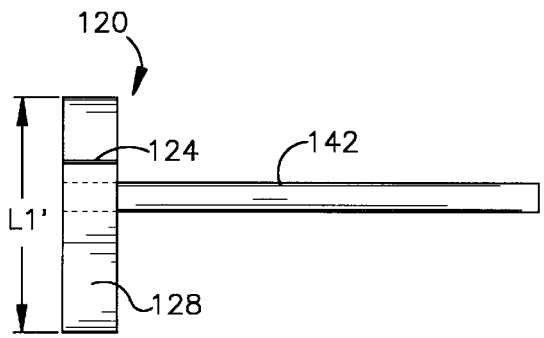
FIG. 11 is a side elevation view of the filament plate of FIG. 9 as seen from a plane indicated by the line 11—11 in FIG. 10.

FIGS. 9–11 illustrate an alternate embodiment of the filament plate of the present invention. The filament plate 120 is generally rectangular in profile and has rounded corners. The filament plate 120 includes two spiral slits 122, 124 through a width W' of the plate. The slits 122, 124 extend from respective side walls 126, 128 and spiral toward a center region C of the filament plate 120. As can best be seen in FIG. 10, the slits 122, 124 overlap and are parallel over most of their respective lengths. A gap width or normal distance between opposing interior wall surfaces of the filament plate 120 defining each slit 122, 124 is uniform along the length of the slit. Moreover, the gap width is substantially the same for each slit. Suitable, dimensions for a length L1' of the short side walls 126, 128 and a length L2' of the long side walls 132, 134, the width W' of the filament plate 120 and the gap width are as follows:

|  | Dimension |
|---|---|
| L1' | 1.5 cm. |
| L2' | 2.0 cm. |
| W' | 0.3 cm. |
| Gap width distance of each slit 122, 124 | 0.3 mm. |

The filament plate 120 includes two throughbores spaced inwardly from side walls 126, 128. A pair of spaced apart conductive posts 140, 142 are press fit into respective openings. The power feeds 88 are connected to the conductive posts 140, 142. When the power feeds 88 are energized, a current flows through the plate 120 along a spiraled labyrinth path I' (FIG. 10).

A magnitude of the current I' through the filament plate 120 is suitably adjusted to raise a temperature of the plate through which the current I' flows to the thermionic emission temperature causing the plate to emit free electrons. A top surface 144 of the filament plate 120 provides a large, efficient surface for thermionic emission.

The gap width of the slits 122, 124 is not substantially larger than ten times the Debye shielding length of a charged plasma generated from typical source materials injected into the arc chamber interior region 68. This minimizes penetration of the energized plasma into the gaps of the slits 122, 124 and, thus, minimizes erosion of the interior wall surfaces defining the slits. As noted with respect the first embodiment, erosion by sputtering is substantially limited to the top surface 144 of the filament plate 120. Sputtering does not occur on a bottom surface 144 of the filament plate 120 because a volume of the arc chamber interior region 58 defined between the filament plate bottom surface 144 and the region of the arc chamber side wall 66 through which the conductive posts 140, 142 extend is too small to sustain a plasma.

The present invention has been described with a degree of particularity, but it is the intent that the invention include all modifications from the disclosed preferred design failing within the spirit or scope of the appended claims.

I claim:

1. An ion source filament supported in an interior region of an ionization chamber, the filament comprising:

a) a block of conductive material having a top surface and a bottom surface spaced apart by a side wall, at least one of the top and bottom surfaces emitting ionizing electrons into the arc chamber interior region as current flows through the block;

b) first and second conductive posts electrically coupled to the block to apply a voltage potential difference between two spaced apart locations of the block and to cause a current flow through an interior of the block between the two spaced apart locations; and c) the block defining at least one slit through a width of the block extending from a side wall of the block into the interior of the block to lengthen a current path between the two spaced apart locations.

2. The apparatus of claim 1 wherein the block is constructed of tungsten.

3. The apparatus of claim 1 wherein a gap width between aligned surfaces defining the slit no more than 10 times greater than a Debye length of the energized plasma supported in the arc chamber interior region.

4. The apparatus of claim 1 wherein the top surface and the bottom surface of the block are generally planer and the block includes two nonintersecting slits extending into the interior from the side wall.

5. The apparatus of claim 4 wherein the two slits extend inwardly from the side wall in respective spaced apart spiral configurations which terminate at a central region of the block forming a spiralled labyrinth current flow path bounded at least in part by the two slits.

6. The apparatus of claim 5 wherein the two slits spiral inward at tighter radii about a common center region of the block to form a current path of about the same width from an outer portion to an inner portion of the electron emitting surface of the block.

7. An ion source for emitting ions along a travel path for ion beam treatment of a workpiece comprising:

a) structure defining an ionization chamber having a chamber interior bounded by an exit aperture for emitting ions and having an input for routing an ionizable material into a chamber interior; and b) an ion source filament positioned within the chamber interior for emitting electrons into the chamber interior that ionize said ionizable material comprising i) a block of conductive material having an electron emitting surface that provides ionizing electrons as current flows through the conductive material of the block; and ii) first and second electrodes electrically coupled to the block to apply a voltage potential difference between two spaced apart locations of the block to causes a current flow between the electrodes; wherein said block defines one or more gaps that extend into an interior region of the block from an outer surface of the block to lengthen a current path between the two electrodes at the spaced apart locations.

* * * * *